(12) United States Patent
Yin et al.

(10) Patent No.: US 8,703,617 B2
(45) Date of Patent: *Apr. 22, 2014

(54) METHOD FOR PLANARIZING INTERLAYER DIELECTRIC LAYER

(75) Inventors: Huaxiang Yin, Beijing (CN); Qiuxia Xu, Beijing (CN); Lingkuan Meng, Beijing (CN); Tao Yang, Beijing (CN); Dapeng Chen, Beijing (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 163 days.

This patent is subject to a terminal disclaimer.

(21) Appl. No.: 13/147,044

(22) PCT Filed: Feb. 17, 2011

(86) PCT No.: PCT/CN2011/071056
§ 371 (c)(1),
(2), (4) Date: Jul. 29, 2011

(87) PCT Pub. No.: WO2012/083603
PCT Pub. Date: Jun. 28, 2012

(65) Prior Publication Data
US 2012/0164838 A1    Jun. 28, 2012

(30) Foreign Application Priority Data
Dec. 22, 2010    (CN) .......................... 2010 1 0601744

(51) Int. Cl.
H01L 21/302    (2006.01)
H01L 21/461    (2006.01)
B44C 1/22    (2006.01)
C03C 15/00    (2006.01)
C03C 25/68    (2006.01)
C23F 1/00    (2006.01)

(52) U.S. Cl.
USPC ........... 438/689; 438/706; 438/734; 438/708; 438/714; 216/38; 216/58; 216/67

(58) Field of Classification Search
None
See application file for complete search history.

(56) References Cited

U.S. PATENT DOCUMENTS 4,515,652 A * 5/1985 Gimpelson et al. ........... 438/697
4,824,521 A 4/1989 Kulkarni et al.
(Continued)

FOREIGN PATENT DOCUMENTS

CN    1238886 C    1/2006

OTHER PUBLICATIONS

"International Application Serial No. PCT/CN2011/071056, International Search Report mailed Oct. 13, 2011", 6 pgs.

(Continued)

Primary Examiner — Nadine Norton
Assistant Examiner — Stephanie Duclair
(74) Attorney, Agent, or Firm — Schwegman Lundberg & Woessner, P.A.

(57) ABSTRACT

The present application discloses provides a method for planarizing an interlayer dielectric layer, comprising the steps of: providing a multilayer structure including at least one sacrificial layer and at least one insulating layer under the sacrificial layer on the semiconductor substrate and the first gate stack, performing a first RIE on the multilayer structure, in which a reaction chamber pressure is controlled in such a manner that an etching rate of the portion of the at least one sacrificial layer at a center of a wafer is higher than that at an edge of the wafer, so as to obtain a concave etching profile; performing a second RIE on the multilayer structure to completely remove the sacrificial layer and a part of the insulating layer, so as to obtain the insulating layer having a planar surface which serves as an interlayer dielectric layer. The planarization process can replace a CMP process for providing an interlayer dielectric layer having a planar surface, which achieves a relative larger available area of the wafer.

10 Claims, 6 Drawing Sheets

(56) References Cited

U.S. PATENT DOCUMENTS

| | | | |
|---|---|---|---|
| 5,316,980 A | | 5/1994 | Takeshiro |
| 5,880,039 A | | 3/1999 | Lee |
| 6,475,917 B1 | * | 11/2002 | Shen et al. ............. 438/712 |
| 8,324,061 B2 | * | 12/2012 | Yin et al. ............. 438/303 |
| 2010/0033055 A1 | * | 2/2010 | Nakatani ............. 310/313 R |

OTHER PUBLICATIONS

"International Application Serial No. PCT/CN2011/071056, Written Opinion mailed Oct. 13, 2011", 6 pgs.

* cited by examiner

METHOD FOR PLANARIZING INTERLAYER DIELECTRIC LAYER

CROSS-REFERENCE TO RELATED APPLICATIONS

This application is a nationalization under 35 U.S.C. §371 of International Application No. PCT/CN2011/071056, filed on Feb. 17, 2011 and published as WO 2012/083603, on Jun. 28, 2012, which claims priority under 35 U.S.C. §119 to Chinese Application No. 201010601744.0, filed Dec. 22, 2010, the entire contents of which are incorporated herein by reference in their entirety.

FIELD OF THE INVENTION

The present invention relates to a method for manufacturing a semiconductor device, and more particularly to a method for planarizing an interlayer dielectric (ILD) layer.

BACKGROUND OF THE INVENTION

In the interconnect technique of an integrated circuit, an ILD layer is typically used for separating a metal wiring layer from an active layer of a semiconductor device, or from another metal wiring layer. The electric connection between the metal wiring layers, or between the metal wiring layer and the active layer of the semiconductor device can be implemented by means of conductive vias through the ILD layer.

The ILD layer having a planar surface is beneficial for depositing and patterning subsequent layers, and also is beneficial for electrical isolation between the metal wiring layer and the underlying layer of the semiconductor device, and further is beneficial for forming multi-level metal wiring interconnections. The ILD layer having a planar surface also improves mechanical strength and reliability of the semiconductor device, because there is no defect such as holes occurring during later-layer deposition.

To form an ILD having a planar surface, the ILD layer is subjected to Chemical Mechanical Polishing (CMP) after the ILD layer is deposited, which increase complexity and costs of the manufacturing process, especially for a first insulating layer for isolating the gate stack structure with a super small gate length.

The CMP process can be replaced by a dual-layer ILD layer structure provided by firstly depositing a conformal insulating layer, such as a low temperature oxide (LTO) layer, and then depositing a spin-on glass (SOG) layer thereon, wherein the LTO layer forms a conformal layer which covers a large area of a wafer, and the SOG layer further fills recesses on the surface, and thus a substantially planar surface can be obtained.

Then, in order to further form a planar surface, the SOG layer can be etched back by dry etching, such as reactive ion etching (RIE), so as to planarize its surface. Typically, a mixture of trifluoromethane ($CHF_3$), tetrafluoromethane ($CF_4$) and Oxygen ($O_2$) is used as an etching gas in the RIE.

In U.S. Pat. No. 5,316,980A of Shinichi Takeshiro etc., it is further proposed that a mixture of trifluoromethane ($CHF_3$) and hexafluoroethane ($C_2F_6$) can be used as the etching gas, so that an etching rate of the organic SOG layer is lower than that of an underlying $SiO_2$ layer. Consequently, a planar surface of the structure can still be provided even in a case that the underlying $SiO_2$ layer is partly exposed.

However, the SOG layer etching method mentioned above actually can not achieve global planarization. It has been found that the etching rate of the SOG layer at the center of the wafer is lower than that at the edge of the wafer. As will be described, the etched SOG layer has a convex etching profile. As a result, the edge of the wafer has to be discarded since the thickness of SOG layer at the edge can not achieve the desired planarization and should be discarded, which reduces an available area of the wafer for manufacturing the semiconductor device.

SUMMARY OF THE INVENTION

One object of the present invention is to provide a method for planarizing an interlayer dielectric layer which improves a global planarization and provides a larger available wafer area.

According to the present invention, there provides a method for planarizing an interlayer dielectric layer, comprising the steps of: providing a multilayer structure including at least one sacrificial layer and at least one insulating layer under the sacrificial layer on the semiconductor substrate and the first gate stack; performing a first RIE on the multilayer structure, in which a reaction chamber pressure is controlled in such a manner that an etching rate of the portion of the at least one sacrificial layer at a center of a wafer is higher than that at an edge of the wafer, so as to obtain a concave etching profile; performing a second RIE on the multilayer structure to completely remove the sacrificial layer and a part of the insulating layer, so as to obtain the insulating layer having a planar surface which serves as an interlayer dielectric layer.

Preferably, an additional RIE is inserted between the first RIE and the second RIE, in which a reaction chamber pressure is controlled in such a manner that an etching rate of the portion of the at least one sacrificial layer at the center of the wafer is lower than that at the edge of the wafer, so as to reduce a concave degree of the concave etching profile.

The method of the present invention performs an etchback on the multilayer structure comprising at least one sacrificial layer and at least one insulating layer by two or three steps of RIE which replaces a CMP process. The method not only eliminates conformal characteristic on the whole ILD layer, which achieves a good local planarization, but also compensates for overetching of the insulating layer at the edge of the wafer, which achieves a global planarization on the whole wafer and significantly increases an available area of the wafer.

The insulating layer after etchback has a planar surface. Thus, it is not necessary to be processed by a CMP process using an expensive CMP equipment. The process time can be saved and manufacturing costs of the device can be reduced.

The two or three steps of RIE in the planarization process can be performed successively in the same reaction chamber, with a specific etching gas, a specific reaction chamber pressure, a specific RF power used for each RIE step. Thus, the process of manufacturing the semiconductor device can be simplified.

The sacrificial layer material can be various materials which are well-known and suitable for RIE, even for photoresist. Compared with SOG, spin coating and curing of photoresist are much simpler processes, which reduces complexity of the process introduced by the sacrificial layer.

DETAILED DESCRIPTION OF PREFERRED EMBODIMENTS

Exemplary embodiments of the present invention are described in more details below with reference to the accompanying drawings. In the drawings, like reference numerals denote like members. The figures are not drawn to scale, for the sake of clarity.

Some particular details of the invention will be described below, such as an exemplary semiconductor structure, material, dimension, process step and manufacturing method of the device, for a better understanding of the present invention. Nevertheless, it can be understood by one skilled person in the art that these details are not always essential for but can be varied in a specific implementation of the invention. Unless the context clearly indicates otherwise, each part of the semiconductor device can be made of material(s) well known to one skilled person in the art.

Figure 1:
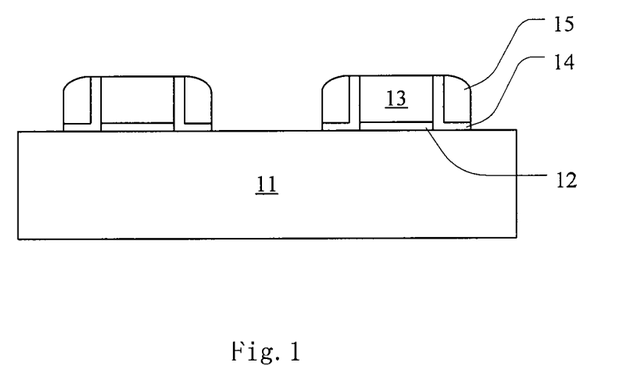
FIG. 1 shows a schematic cross sectional view of a semiconductor structure after a dummy gate is formed according to the prior-art gate-last process.

FIG. 1 shows a schematic cross sectional view of a semiconductor structure after a dummy gate is formed according to the prior-art gate-last process, wherein a gate stack, including a gate dielectric 12 and a gate conductor 13 on the gate dielectric 12, can be formed on a semiconductor substrate 11, and gate spacers, including an oxide layer 14 and a nitride layer 15, are formed at two sides of the gate stack. The gate conductor 13 (e.g., polycrystalline silicon) in the gate stack structure is used as a dummy gate, which will be removed after a planar ILD layer is formed, and will be replaced with a metal gate, i.e., a replacement gate. The gate dielectric 12 can be replaced with a new gate dielectric 12'.

Although not shown, it can be understood that the gate stack is used as a barrier layer for forming self-aligned source/drain regions in the substrate 11 by ion implantation. Then, the dopants are activated by a rapid thermal anneal.

Although not shown, it can be understood that preferably, a hard mask such as $SiO_2$ is formed on the top of the gate stack (e.g. in a process of manufacturing the gate stack having a supper small gate length by RIE), before the ion implantation for the source/drain regions, so as to define an implantation area and a non-implantation area better during the ion implantation for the source/drain regions, and to define a silicide area better in a silication step.

Although not shown, it can be understood that preferably, a metal layer (e.g., Ni, NiPt, Ti or Co) is deposited on the source/drain regions with the spacers and the hard mask as a barrier layer, and the metal layer is silicated to form self-aligned metal silicide so as to reduce a contact resistance between a wiring layer and an active layer, after the ion implantation for the source/drain regions.

Figure 2:
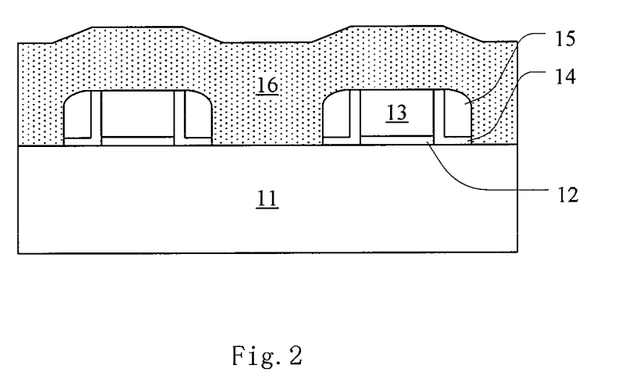
FIG. 2 shows a schematic cross sectional view of the semiconductor structure after an LTO layer is deposited on the semiconductor structure as shown in FIG. 1.
Figure 3:
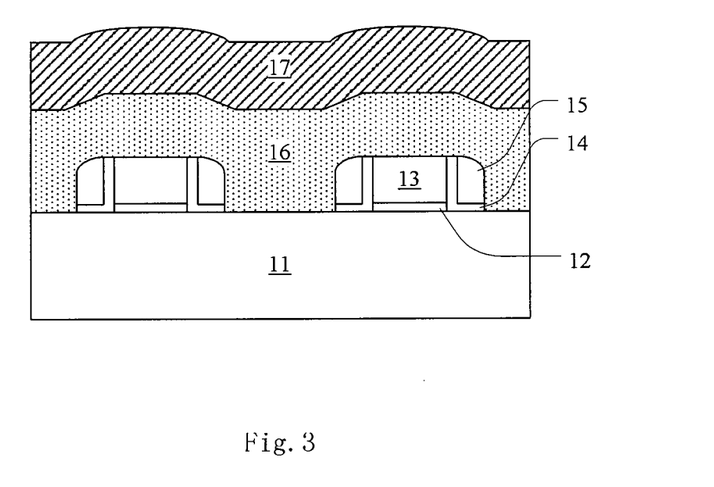
FIG. 3 shows a schematic cross sectional view of the semiconductor structure after an SOG layer is spun on the semiconductor structure as shown in FIG. 2.

Then, an LTO layer 16 and a spin-on SOG layer 17 are subsequently deposited on the semiconductor structure as shown in FIG. 1, which are illustrated in FIGS. 2 and 3 respectively. A chemical vapor deposition process for forming the LTO layer 16 and a spin-on process for forming the SOG layer 17 are well-known in the art.

In the following etching step, the SOG layer 17 is removed as a sacrificial layer, and the LTO layer 16 is used as an interlayer dielectric (ILD) layer of the resultant device. Hereinafter, in order to meet requirements for a planarization process, the thickness of the LTO layer 16 is about 50 nm to 3000 nm, and the thickness of the SOG layer 17 is about 50 nm to 2000 nm.

The LTO layer 16 and the SOG layer 17 are substantially conformal. That is, the portion of the LTO layer 16 and the SOG layer 17 that covers the gate stack exhibits a convex shape to a certain extent.

Figure 4:
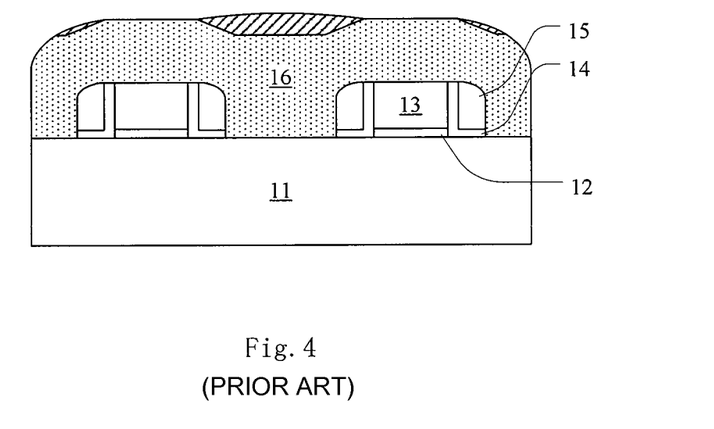
FIG. 4 shows a schematic cross sectional view of the semiconductor structure after an etchback is performed on the SOG layer according to the prior-art etching process.

According to the prior-art etching process, an etchback is performed on the SOG layer for the semiconductor structure having the LTO layer 16 and the SOG layer 17 as shown in FIG. 3 by RIE, as illustrated in FIG. 4. In this embodiment, a Rainbow 4420 type plasma etcher (available from Lam Research Corporation, U.S.) is used. The RIE process is performed with about 400 RF power and an etching gas which is a mixture of trifluoromethane ($CHF_3$), tetrafluoromethane ($CF_4$) and argon gas (Ar). The flow of $CHF_3$ is about 50 sccm, the flow of $CF_4$ is about 15 sccm, and the flow of Ar is about 300 sccm. The pressure in the reaction chamber is maintained to 250 mtorr.

During etching, an etchback time is controlled in such a manner that the RIE stops at a top surface of the LTO layer 16.

The etchback on the SOG layer 17 achieves a good local planarization. The surface of the SOG layer 17 becomes flat where the gate stack is covered.

However, an etching rate of the SOG layer 17 at a center portion of the wafer is smaller than that at an edge of the wafer. More SOG remains at the center of the wafer than that at the edge of the wafer. As a result, the etched SOG layer 17 has a convex profile. In the embodiment illustrated in FIG. 4, not only the SOG is completely removed, but also a portion of the underlying LTO is removed at the edge of the wafer.

Figure 5:
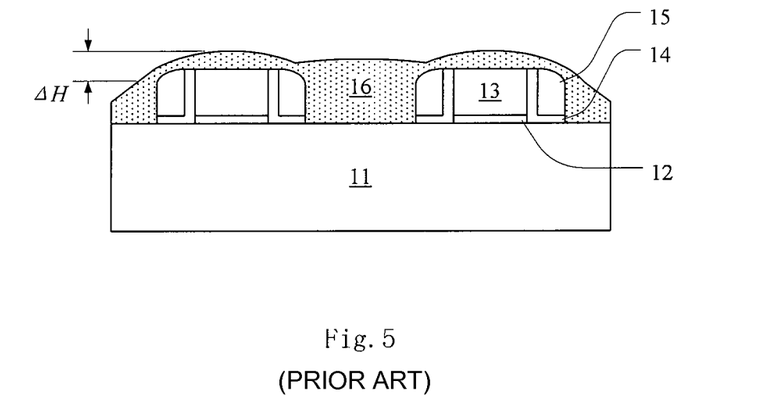
FIG. 5 shows a schematic cross sectional view of the semiconductor structure after an etchback is performed further on the LTO layer according to the prior-art etching process.

FIG. 5 shows a schematic cross sectional view of the semiconductor structure after an etchback is performed further on the LTO layer by RIE according to the prior-art etching process. Both of this etching step and the etchback on the SOG layer are performed in the same reaction chamber, and can use the same etching gas having the same compositions but different proportions. For example, it is performed with about 550 W of RF power and an etching gas which is a mixture of trifluoromethane ($CHF_3$), tetrafluoride ($CF_4$) and argon (Ar) gas, wherein the flow of $CHF_3$ is about 25 sccm, the flow of $CF_4$ is about 25 sccm, and the flow of Ar is about 300 sccm, and the pressure in the reaction chamber is maintained at 250 mtorr.

The etchback of this etching step firstly removes the remaining portion of the SOG layer 17 at the top surface of the LTO layer 16, and is then performed on the LTO layer 16.

As mentioned above, after the etchback of the SOG layer, the wafer has a convex etching profile. Since the portion of the underlying LTO at the edge of the wafer has been removed and is not covered with the SOG layer 17, it undergoes etching earliest in the step of etchback on the LTO layer 16. Moreover, under the above conventional etching conditions, an etching rate at the SOG layer 17 is smaller than that at the LTO layer, the ratio of which is 1:2. Consequently, an etching rate of the LTO layer 16 at an edge of the wafer is larger than that at a center portion of the wafer.

The resultant ILD layer comprises only the remaining portion of the LTO layer 16 having a convex etching profile. Moreover, the portion of the LTO layer 16 at the top of the gate conductor 13 provides a cap so that the gate conductor 13 is not exposed.

Cl-base RIE or TMAH wet-etching is used in the subsequent step of removing the gate conductor 13 (not shown). However, the remaining portion of the LTO layer 16 prevents an etchant from reaching the gate conductor 13. Consequently, the etching process for removing the dummy gate can not be performed. The above-mentioned process for removing the gate conductor 13 has extremely high selectivity for a material of the gate conductor with respect to silicon dioxide. Any of the remaining silicon dioxide will impede the removal of the gate conductor.

Figure 6:
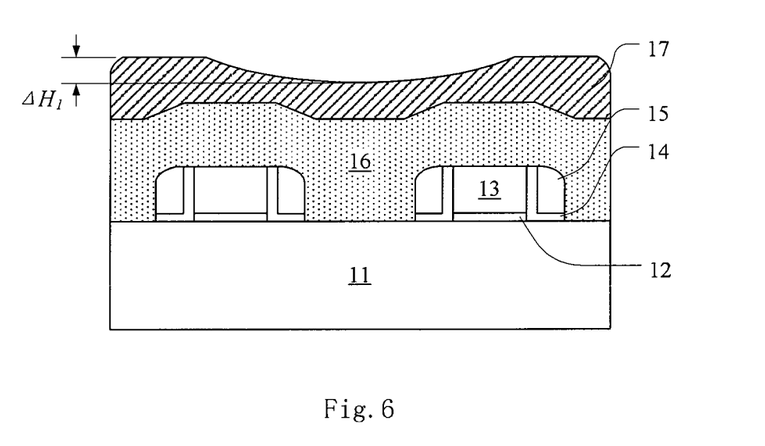
FIG. 6 shows a schematic cross sectional view of the semiconductor structure after a first etchback is performed on the SOG layer according to the method of the present invention.

According to the etching method of the present invention, a first etchback is performed on the SOG layer for the semiconductor structure having the LTO layer 16 and the SOG layer 17 as shown in FIG. 3 by RIE, as illustrated in FIG. 6. In this embodiment, a Rainbow 4420 type plasma etcher (available from Lam Research Corporation, U.S.) is used. The RIE process is performed with about 450 RF power and an etching gas which is a mixture of trifluoromethane ($CHF_3$), tetrafluoromethane ($CF_4$) and argon gas (Ar). The flow of $CHF_3$ is about 50 sccm, the flow of $CF_4$ is about 15 sccm, and the flow of Ar is about 300 sccm. The pressure in the reaction chamber is maintained to 350 mtorr.

During etching, an etchback time is controlled in such a manner that the RIE removes only the SOG layer 17, but does not reach a top surface of the LTO layer 16.

The etchback on the SOG layer 17 achieves a good local planarization. The surface of the SOG layer 17 becomes flat where the gate stack is covered.

Moreover, an etching rate of the SOG layer 17 at a center portion of the wafer is larger than that at an edge of the wafer. Less SOG remains at the center of the wafer than that at the edge of the wafer. As a result, the etched SOG layer 17 has a concave profile.

The measurement results show that a maximum of a height difference $\Delta H_1$ of the surface shape is only about 20 nm$\leq \Delta H_1 \leq$75 nm, and a slope (which is defined as a ratio of the height difference of the surface shape between the center and the edge of the wafer and a radius of the wafer) is about between 5e-7 and 2e-6. Thus, it is guaranteed that the available area of the wafer is not substantially reduced.

The inventor found that for the etching on the SOG layer 17, the etching rate at the edge of the wafer is higher than that at the center of the wafer under a conventional lower atmospheric pressure (<325 mtorr), so as to form a convex etching profile and produce a smaller available diameter of the wafer; while under a higher atmospheric pressure (>325 mtorr) used in the present invention, the etching rate at the edge of the wafer is lower than that at the center of the wafer (the difference between the etching rates is higher than 0 and lower than 20 Å/s), which may form a concave etching profile as shown in FIG. 6. A setting value of an optimal pressure is slightly high, which is about 350 mtorr, so as to obtain the concave etching profile and a quicker etching rate as desired in the present invention.

Moreover, the inventor found that the etching rate at the edge of the wafer is lower than that at the center of the wafer, and is varied substantially as a linear function of the RF power, in a range of the RF power from 350 W to 550 W, at a pressure of 350 mtorr. Thus, the concave etching profile as described above is formed, and a larger available diameter of the wafer is achieved. Therefore, variation of the RF power may not completely change the shape of the etching profile (i.e. from convex to concave, or vice versa), which is contrary to the effect of pressure. A maximum etching rate difference is obtained under about 450 W of RF power, which, in other words, provides a concave etching profile having a maximum relative height difference. It achieves a maximum available diameter of the wafer.

At the etching step in the above embodiment according to the method of the present invention, the pressure of the reaction chamber is higher than about 325 mtorr, the optimal value of the pressure in the reaction chamber is about 350 mtorr, and the optimal RF power is about 450 W.

However, it is appreciated that specific values of the pressure of the reaction chamber and the RF power may depend on the type of the etcher, the spacing between the electrodes, the volume of the reaction chamber, and compositions, proportion, and flow of the etching gas.

Figure 7:
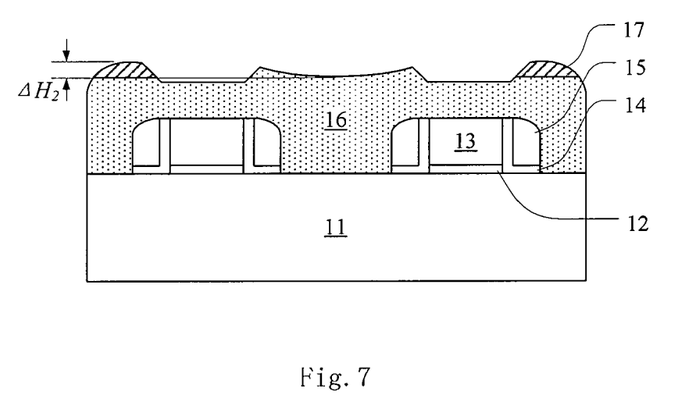
FIG. 7 shows a schematic cross sectional view of the semiconductor structure after a second etchback is performed on the SOG layer according to the method of the present invention.

As an alternative step, a second etchback is performed on the SOG layer for the semiconductor structure in which the first etchback has been performed on the SOG layer as shown in FIG. 6, according to the etching method of the present invention, as illustrated in FIG. 7. Both of this etching step and the step of the first etchback on the SOG layer are performed in the same reaction chamber, and can use the same etching gas having the same compositions and the same proportion. For example, it is performed with about 400 W of RF power and an etching gas which is a mixture of trifluoromethane ($CHF_3$), tetrafluoride ($CF_4$) and argon (Ar) gas, wherein the flow of $CHF_3$ is about 50 sccm, the flow of $CF_4$ is about 15 sccm, and the flow of Ar is about 300 sccm, and the pressure in the reaction chamber is maintained at 250 mtorr.

In fact, the process condition of the second etchback on the SOG layer can be the same as that of the conventional etchback on the SOG layer as shown in FIG. 4. Thus, the same etching characteristic is obtained. That is, in the step of second etchback on the SOG layer, the etching rate of the SOG layer 17 at the center of the wafer is lower than that at the edge of the wafer.

During the second etchback on the SOG layer, firstly a portion of the SOG layer 17 at the center of the wafer which has a smaller thickness is removed, and optionally, a portion of the LTO layer 16 at the center of the wafer is slightly overetched at the center of the wafer. An amount of overetching on the LTO layer 16 is in a range of 5 nm to 80 nm. Typically, the etching rate of the second etchback on the SOG layer is lower than that of the first etchback on the SOG layer, so that the amount of the overetching on the LTO layer 16 is easily controlled.

After the second etchback on the SOG layer 17, most parts of the LTO layer 16 under the SOG layer 17 is exposed. It is possible that some SOG remains at the edge of the wafer, so as to eliminate an overetching area of the LTO layer 16 at the edge of the wafer.

The measurement results show that a maximum of a height difference $\Delta H_2$ of the surface shape is only about 0 nm$\leq \Delta H_2 \leq$30 nm, and a slope is about between 0 and 7.5e-7.

The second etchback on the SOG layer may reduce the concave degree of the SOG layer 17 after the first etchback on the SOG layer is performed, so that the surface is close to a planar surface. On one hand, it provides a flatter planar surface, and on the other hand, it is guaranteed that the available area of the wafer is not reduced substantially.

Figure 8:
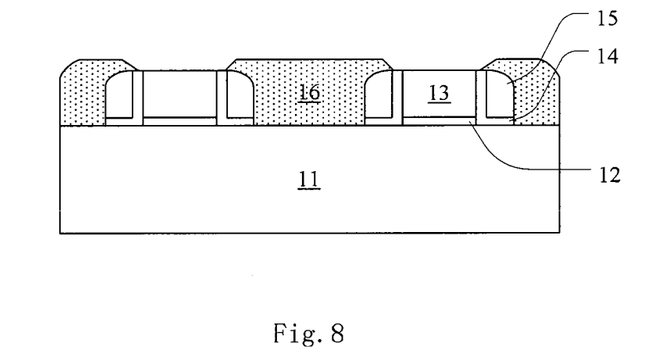
FIG. 8 shows a schematic cross sectional view of the semiconductor structure after an etchback is performed on the LTO layer according to the method of the present invention.

FIG. 8 shows a schematic cross sectional view of the semiconductor structure after an etchback is performed further on the LTO layer by RIE according to the etching process of the present invention. This etching step is performed in the same reaction chamber as the steps of the first and alternative second etchback on the SOG layer, and can use the same etching gas having the same compositions but the different proportions. For example, it is performed with about 550 W of RF power and an etching gas which is a mixture of trifluoromethane ($CHF_3$), tetrafluoromethane ($CF_4$) and argon gas (Ar), wherein the flow of $CHF_3$ is about 25 sccm, the flow of $CF_4$ is about 25 sccm, and the flow of Ar is about 300 sccm, and the pressure in the reaction chamber is maintained at 250 mtorr.

Actually, the process condition of the etchback on the LTO layer is the same as that of the conventional etchback on the LTO layer as shown in FIG. 5. Thus, the same etching characteristics is obtained. That is, the etching rate of the LTO layer 16 at the edge of the wafer is higher than that at the center of the wafer.

In this etchback step, firstly the remaining portion of SOG layer 17 at the top of the LTO layer 16 at the edge of the wafer is removed, and then the LTO layer 16 is further etched.

As illustrated above, after the first and the second etchback on the SOG layer 17, the profile of the SOG layer 17 has a concave shape. What is more, a part of the LTO material underneath has been overetched at the center of the wafer. In the step of the etchback on the LTO layer 16, the portion of the LTO layer 16 at the edge of the wafer is covered by the SOG layer 17 at the start of the etching, and thus undergoes etching later.

The SOG layer 17 is used as the sacrificial layer, which provides the concave etching profile during the etching, so as to compensate for the overetching on the LTO layer 16 at the edge of the wafer, and to obtain the global planarization of the whole wafer.

Under the above etching conditions, an etching rate at the LTO layer is higher than that on the SOG layer, the ratio of which is 2:1. In this case, the etch rate of LTO at the center is slower because the portion of the LTO layer 16 at the center of the wafer is covered by the SOG layer; while the portion of the LTO layer 16 at the edge of the wafer is etched more quickly. As a result, the portion of the LTO layer 16 at the edge of the wafer will become thinner. After etchback of both the SOG layer and the LTO layer, the surface of the whole wafer is much flatter due to the compensation effect. Although the edge of the wafer is slightly overetched, an available area of the wafer is significantly larger than that according to the etching method in the prior art.

The resulting ILD layer includes only the remaining LTO layer 16, and has a substantially planar profile.

Moreover, the portion of the LTO layer 16 at the top of the gate conductor 13 is completely removed to expose to the gate conductor 13. In the subsequent step of removing the gate conductor 13 (not shown), the etchant will reach easily the gate conductor 13 so that the gate conductor 13 can be removed by wet etching.

Figure 9:
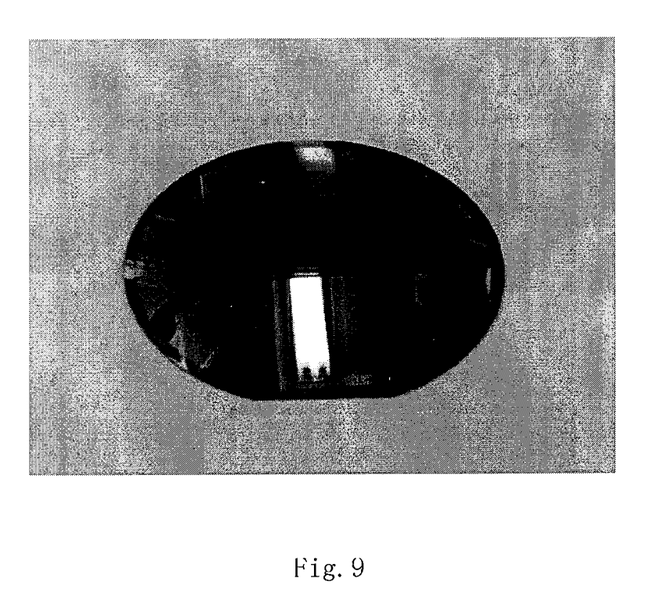
FIGS. 9 and 10 show a photograph and a cross sectional view of the wafer after being etched with the prior-art method.
Figure 10:
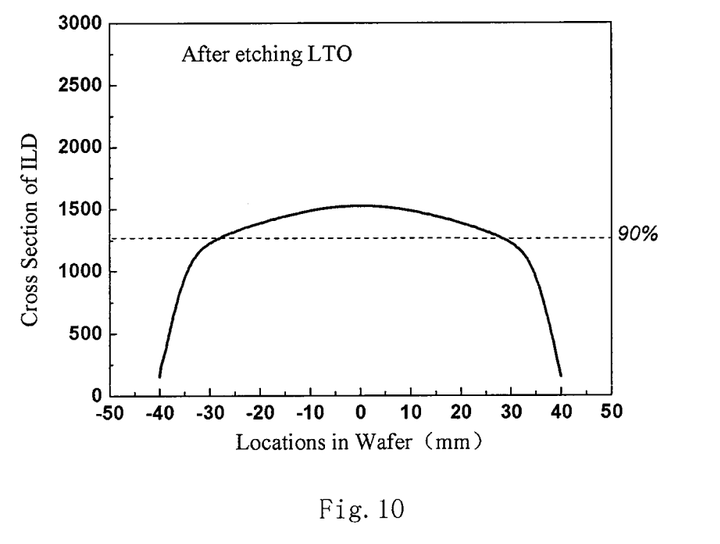

FIGS. 9 and 10 show a photograph and a cross sectional view of the wafer after being etched with the prior-art method; It can be observed from the photograph shown in FIG. 9 that the surface of the wafer, after being etched in the steps shown in FIGS. 4 and 5, has a convex shape.

A surface topography is measured with NANOSPEC/AFT Layer Thickness Analyzer (available from KLA-Tencor Corporation, U.S.). To evaluate an available area of the wafer, the concepts of an effective area and a relative height different are introduced herein. In the present application, the effective area is defined as an area of the wafer where an actual height H of the surface topography satisfies $H > 90\% * H_0$, wherein $H_0$ denotes an average height of the surface topography at a center portion (within 30% of $D_0$, wherein $D_0$ is an original diameter of the wafer) of the wafer. The relative height difference $\Delta H$ is defined as a difference between a height $H_{edge}$ at the edge of the effective area and a height $H_{center}$ at the center of the effective area, i.e. $\Delta H = H_{edge} - H_{center}$. The available area of the wafer is an area of the effective area of the wafer. For a circular wafer, the available area of the wafer can be represented by a diameter of the effective area of the wafer, which is characterized by an available diameter D of the wafer. The relative height $\Delta H$ roughly represents a shape of the surface profile. If $\Delta H$ is less than 0, the surface profile has a convex shape; and if $\Delta H$ is larger than 0, the surface profile has a concave shape.

The measurement results show that the wafer, which has an original diameter of 100 mm, has a reduced available diameter of about 60 mm after being etched, though conformal characteristics at the surface of the wafer are eliminated. The relative height difference $\Delta H$ is about −30 nm. That is, the whole wafer has a (global) convex etching profile, as shown in FIG. 10.

Figure 11:
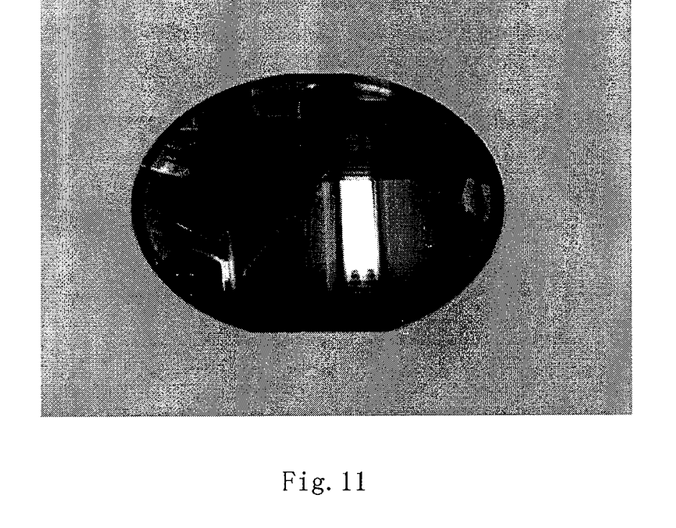
FIGS. 11 and 12 show a photograph and a cross sectional view of the wafer after being etched with the method of the present invention.
Figure 12:
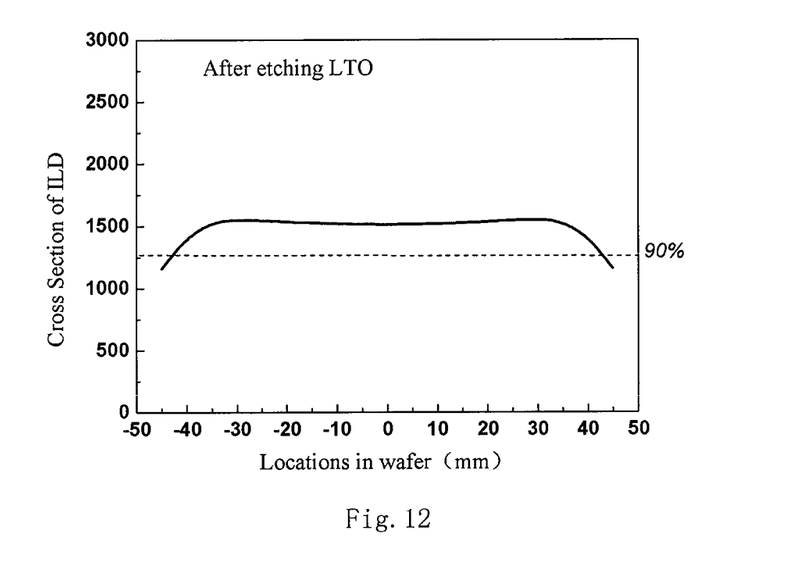

FIGS. 11 and 12 show a photograph and a cross sectional view of the wafer after being etched with the method of the present invention. It can be observed from the photograph shown in FIG. 11 that the surface of the wafer, after being etched in the steps shown in FIGS. 6 and 8, is substantially planar.

The measurement results show that the wafer, which has an original diameter of 100 mm, still has an available diameter of about 80 mm after being etched, while conformal characteristics at the surface of the wafer are eliminated. The relative height difference $\Delta H$ is about 25 nm. That is, the whole wafer has a (global) substantially planar etching profile for the ILD layer.

Moreover, RIE for the SOG layer 17 can use other etching gases known for the SOG layer, for example, a mixture of one or more selected from the group consisting of trifluoromethane ($CHF_3$), tetrafluoromethane ($CF_4$) and sulfur hexafluoride ($SF_6$), with argon gas (Ar). A concave etching profile can still be achieved by controlling a reaction chamber pressure. Moreover, a depth of the concave etching profile can still be adjusted by controlling an RF power. Consequently, a global planarization is optimized and an available area of the wafer is maximized.

The above embodiments describe that the etchback on the SOG layer/LTO layer is used for planarization, so as to obtain the LTO layer 16 having a planar surface which serves as the resultant ILD layer. However, the sacrificial layer of other materials is possible, e.g. photoresist, low K material etc.

For example, the etchant for the photoresist layer is a mixture of argon gas (Ar) and oxygen ($O_2$), wherein the flow of Ar is about 300 sccm, and the flow of $O_2$ is about 5 ccm.

The measurement results similar with that on the SOG layer show that a desired etching rate distribution is obtained, and the concave etching profile as described above is formed, when a reaction chamber pressure is higher than 275 mtorr (the optimal pressure of the reaction chamber is about 300 mtorr) and the RF power is about 300-550 W (the optimal RF power is about 500 W).

However, it can be understood that the specific values of a reaction chamber pressure and the RF power may depend on the type of the etcher, the spacing between the electrodes, the volume of the reaction chamber, and compositions, proportion, and flow of the etching gas.

The RIE method of the photoresist layer may use other etching gases well known for the photoresist layer, such as a mixture of one or more types of oxygen ($O_2$) and tetrafluoromethane ($CF_4$) with argon (Ar) gas. A concave etching profile can still be achieved by controlling a reaction chamber pressure. Moreover, a depth of the concave etching profile can still be adjusted by controlling an RF power. Consequently, a global planarization is optimized and an available area of the wafer is maximized.

As illustrated above, in the present invention, planarization can be implemented with etching a two-layer structure including the sacrificial layer and the insulating layer under the sacrificial layer, wherein the insulating layer is used as ILD. In the etching step, the sacrificial layer provides a concave etching profile, so as to compensate for the overetching on the portion of the insulating layer at the edge of the wafer. However, the present invention may also be applied to a multilayer structure, including at least one sacrificial layer and the insulating layer as ILD. The sacrificial layer may consist of one of SOG, photoresist, and low K material. The insulating layer may consist of one of BPSG, $SiO_2$, and SiNx. For example, the two-layer or multilayer structure used for the etching of ILD can be $SiO_2$/SiNx, LTO/SOG/LTO, $S_iOF$/LTO, low K/LTO, LTO/low K/LTO.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

The invention claimed is:

1. A method for planarizing an interlayer dielectric layer, comprising the steps of:
    providing a multilayer structure including at least one sacrificial layer and at least one insulating layer under the sacrificial layer on the semiconductor substrate and the first gate stack;
    performing a first RIE on the multilayer structure, in which a reaction chamber pressure is controlled in such a manner that an etching rate of the portion of the at least one sacrificial layer at a center of a wafer is higher than that at an edge of the wafer, so as to obtain a concave etching profile;
    performing a second RIE on the multilayer structure to completely remove the sacrificial layer and a part of the insulating layer, so as to obtain the insulating layer having a planar surface which serves as an interlayer dielectric layer; and
    performing an additional RIE between the first RIE and the second RIE, in which a reaction chamber pressure is controlled in such a manner that an etching rate of the portion of the at least one sacrificial layer at the center of the wafer is lower than that at the edge of the wafer, so as to reduce a concave degree of the concave etching profile.

2. The method according to claim 1, wherein the first RIE is performed at least to a depth that a top surface of the insulating layer is exposed at the center of the wafer.

3. The method according to claim 2, wherein the first RIE further overetches the insulating layer at the center of the wafer.

4. The method according to claim 1, wherein the first RIE and the additional RIE use an etching gas having the same compositions and the same proportions, and a reaction chamber pressure for the first RIE is higher than that for the additional RIE.

5. The method according to claim 4, wherein in the first RIE, an RF power is controlled in such a manner that the difference between an etching rate at the portion of the at least one sacrificial layer at the center of the wafer and an etching rate at the portion of the at least one sacrificial layer at the edge of the wafer is maximized.

6. The method according to claim 1, wherein the at least one sacrificial layer consists of one selected from the group consisting of SOG, photoresist, and low K material.

7. The method according to claim 6, wherein the at least one sacrificial layer is an SOG layer, and the etching gas in the first RIE is a mixture of trifluoromethane, tetrafluoromethane and argon gas.

8. The method according to claim 6, wherein the at least one sacrificial layer is a photoresist layer, and the etching gas in the first RIE is a mixture of oxygen and argon gas.

9. The method according to claim 1, wherein the insulating layer consists of one selected from the group consisting of BPSG, $SiO_2$, and SiNx.

10. The method according to claim 9, wherein the insulating layer is an LTO layer, and the etching gas in the second RIE is a mixture of trifluoromethane, tetrafluoromethane and argon gas.

* * * * *

UNITED STATES PATENT AND TRADEMARK OFFICE
CERTIFICATE OF CORRECTION

PATENT NO. : 8,703,617 B2     Page 1 of 1
APPLICATION NO. : 13/147044
DATED : April 22, 2014
INVENTOR(S) : Yin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 165 days.

Signed and Sealed this
Twenty-ninth Day of September, 2015

Michelle K. Lee
*Director of the United States Patent and Trademark Office*